(12) United States Patent
Lee et al.

(10) Patent No.: US 11,460,247 B2
(45) Date of Patent: Oct. 4, 2022

(54) VACUUM DRYER

(71) Applicant: Samsung Display Co., Ltd., Yongin-si (KR)

(72) Inventors: Jung Wook Lee, Yongin-si (KR); Yeon Ju Kwon, Yongin-si (KR); Do Hyun Kim, Yongin-si (KR); Jung Soo Kim, Yongin-si (KR); Ga Hee Park, Yongin-si (KR); Ha Jun Song, Yongin-si (KR); Do Yoon Lee, Yongin-si (KR); Hun Hyeon Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 311 days.

(21) Appl. No.: 16/795,109

(22) Filed: Feb. 19, 2020

(65) Prior Publication Data

US 2020/0309452 A1    Oct. 1, 2020

(30) Foreign Application Priority Data

Mar. 28, 2019  (KR) .................. 10-2019-0036164

(51) Int. Cl.
*F26B 5/04* (2006.01)
*G03F 7/16* (2006.01)
*F26B 3/20* (2006.01)

(52) U.S. Cl.
CPC ............. *F26B 5/045* (2013.01); *F26B 3/20* (2013.01); *G03F 7/168* (2013.01)

(58) Field of Classification Search
CPC ............ F26B 5/045; F26B 3/20; G03F 7/168

USPC ............................................................. 34/60
See application file for complete search history.

(56) References Cited

U.S. PATENT DOCUMENTS

| | | | |
|---|---|---|---|
| 6,006,003 A * | 12/1999 | Kim | H01J 9/261 445/25 |
| 6,263,587 B1 * | 7/2001 | Raaijmakers | C23C 16/0227 34/410 |
| 6,838,115 B2 * | 1/2005 | Kumar | H01L 21/3121 427/372.2 |
| 6,875,281 B2 * | 4/2005 | Kitano | H01L 21/67253 414/935 |
| 8,635,784 B2 * | 1/2014 | Ettinger | H01L 21/67034 34/80 |
| 8,898,928 B2 * | 12/2014 | Sirard | H01L 21/6831 118/728 |
| 2014/0373384 A1 * | 12/2014 | Sirard | H01L 21/67034 34/357 |
| 2015/0024117 A1 * | 1/2015 | Kim | F26B 5/04 34/558 |
| 2020/0309452 A1 * | 10/2020 | Lee | F26B 5/04 |
| 2021/0382003 A1 * | 12/2021 | Guzman | G01N 33/561 |

FOREIGN PATENT DOCUMENTS

KR      10-0784507 B1    12/2007
WO      20150011239 A  *  1/2015

* cited by examiner

*Primary Examiner* — Stephen M Gravini
(74) *Attorney, Agent, or Firm* — Lewis Roca Rothgerber Christie LLP

(57) ABSTRACT

A vacuum dryer including a chamber configured to provide an interior space, support pins in the interior space proximate to a bottom of the chamber, a power supply configured to supply power to the support pins, and a pump coupled to the interior space in the chamber.

20 Claims, 8 Drawing Sheets

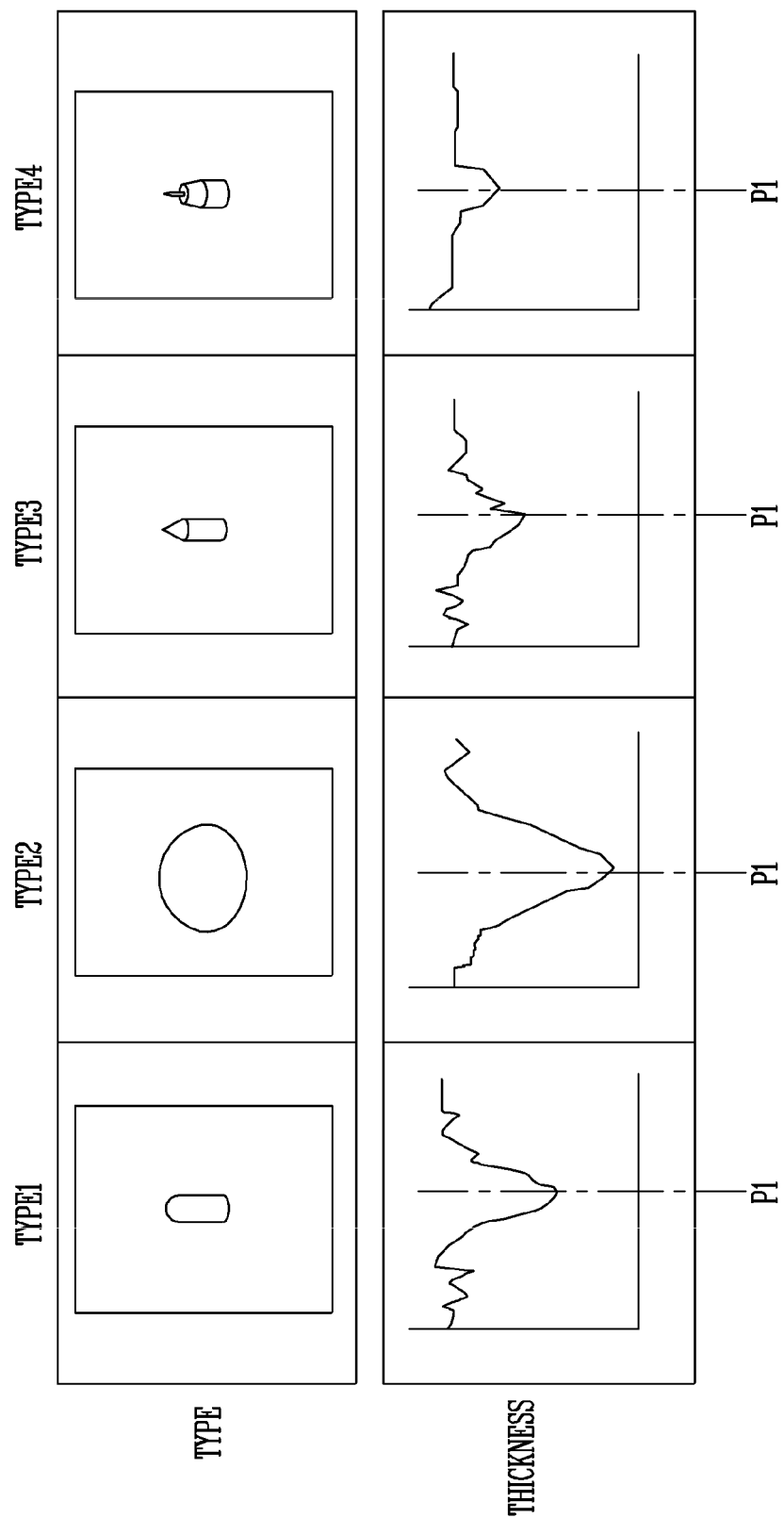

VACUUM DRYER

CROSS-REFERENCE TO RELATED APPLICATION

The present application claims priority to and the benefit of Korean patent application number 10-2019-0036164 filed on Mar. 28, 2019, the entire disclosure of which is incorporated herein in its entirety by reference.

BACKGROUND

1. Field

Various embodiments of the present disclosure relate to a vacuum dryer.

2. Description of the Related Art

Display devices include lines formed on a substrate, transistors coupled to the lines, and light emitting elements configured to emit light in response to current provided from the transistors.

Various patterns (and/or insulating layers) for forming the lines, the transistors, and the light emitting elements may be formed on the substrate by a photolithography technique. For example, patterns may be formed on the substrate through a process including applying photoresist to the substrate, drying by a dryer the substrate to which the photoresist has been applied, and processing the substrate through pattern exposure treatment, developing treatment, heat treatment, etc.

A photoresist layer formed immediately after the operation of applying photoresist has been performed may have fluidity. Thus, during a transfer process for a subsequent process, the thickness of the photoresist layer may vary. Hence, to prevent the thickness of the photoresist layer from varying, a dry process may be performed for the substrate having the photoresist layer thereon.

A dryer may include a chamber and support pins provided on the bottom of the chamber. The substrate may be supported by the support pins. The dryer may dry the substrate by decompressing the internal space of the chamber.

The thickness of photoresist in an area of the substrate corresponding to each support pin (or a position of the support pin) may differ from the thickness of photoresist in other areas. Due to a difference in thickness, uneven drying spots of the photoresist may be caused, which may appears as display spots on a display image of a display device.

To prevent spots from occurring due to the support pins, the support pins may be disposed in a non-display area of the substrate on which an image is not displayed. However, as display devices have a variety of different sizes, additional effort and time may be required to change the positions of the support pins, and additional defects (e.g., due to particles caused during a process of attaching or detaching the support pins) may be created.

SUMMARY

Various embodiments of the present disclosure are directed to a vacuum dryer capable of forming a photoresist layer having a uniform or substantially uniform thickness.

According to an embodiment of the present disclosure, the vacuum dryer includes a chamber configured to provide an interior space, support pins in the interior space proximate to a bottom of the chamber, a power supply configured to supply power to the support pins, and a pump coupled to the interior space in the chamber.

In an embodiment, the vacuum dryer may include a substrate in the interior space to be dried, and the support pins may directly support the substrate.

In an embodiment, the vacuum dryer includes a photoresist on the substrate, and the photoresist may include a solvent having a polarity.

In an embodiment, a voltage level of the power may be based on a magnitude of the polarity of the solvent, and the voltage level of the power may be configured to decrease as the polarity of the solvent increases.

In an embodiment, a temperature of a contact portion of the substrate that contacts one of the support pins may be higher than a temperature of a non-contact portion spaced apart from the support pins.

In an embodiment, each of the support pins may have any one shape of a cylindrical shape, a hemispherical shape, a conical shape, or a needle shape.

In an embodiment, each of the support pins may include a core and a shell configured to enclose the core. The core may include conductive material and the shell may include insulating material.

In an embodiment, a thermal conductivity of the support pins may be approximately 0.3 W/mK or less.

In an embodiment, a voltage level of the power may be based on the thermal conductivity, and the voltage level of the power may be configured to increase as the thermal conductivity increases.

In an embodiment, the power supply may include a power generation circuit configured to generate the power, and a switching circuit configured to couple an output terminal of the power generation circuit to the support pins in response to a first control signal.

In an embodiment, the switching circuit may be configured to couple the support pins to a ground in response to a second control signal.

In an embodiment, the switching circuit may be configured to couple the support pins to a ground before the interior space is decompressed.

In an embodiment, the switching circuit may be configured to couple the output terminal of the power supply to the support pins when the interior space is decompressed.

In an embodiment, when each of the support pins is electrified by the power from the power supply, a thickness of the photoresist in a first area of the substrate may become greater than a thickness of the photoresist in a second area of the substrate. The first area of the substrate may overlap with one the support pins, and the second area of the substrate may be spaced apart from the support pins.

In an embodiment, while the interior space is decompressed, the thickness of the photoresist in the first area may be reduced to be substantially identical to the thickness of the photoresist in the second area.

In an embodiment, the chamber may include a base plate and a cover. The power supply may be configured to supply the power having a first voltage level to the support pins when the cover comes into close contact with the base plate.

In an embodiment, the power supply may be configured to adjust the voltage level of the power to a ground voltage level when the cover is spaced apart from the base plate.

In an embodiment, the vacuum dryer may further include a support plate over the base plate and a lifter coupled to the support plate and configured to adjust a height of the support plate in the interior space. The support pins may be distributed on the support plate.

In an embodiment, the support pins may be electrically coupled to each other through a power line in the support plate.

In an embodiment, the support pins may be coupled independently of each other to the power supply.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIG. 3D is a diagram illustrating various examples of the support pin included in the vacuum dryer of FIG. 1A, in accordance with an embodiment of the present disclosure.

DETAILED DESCRIPTION

Figure 1A:
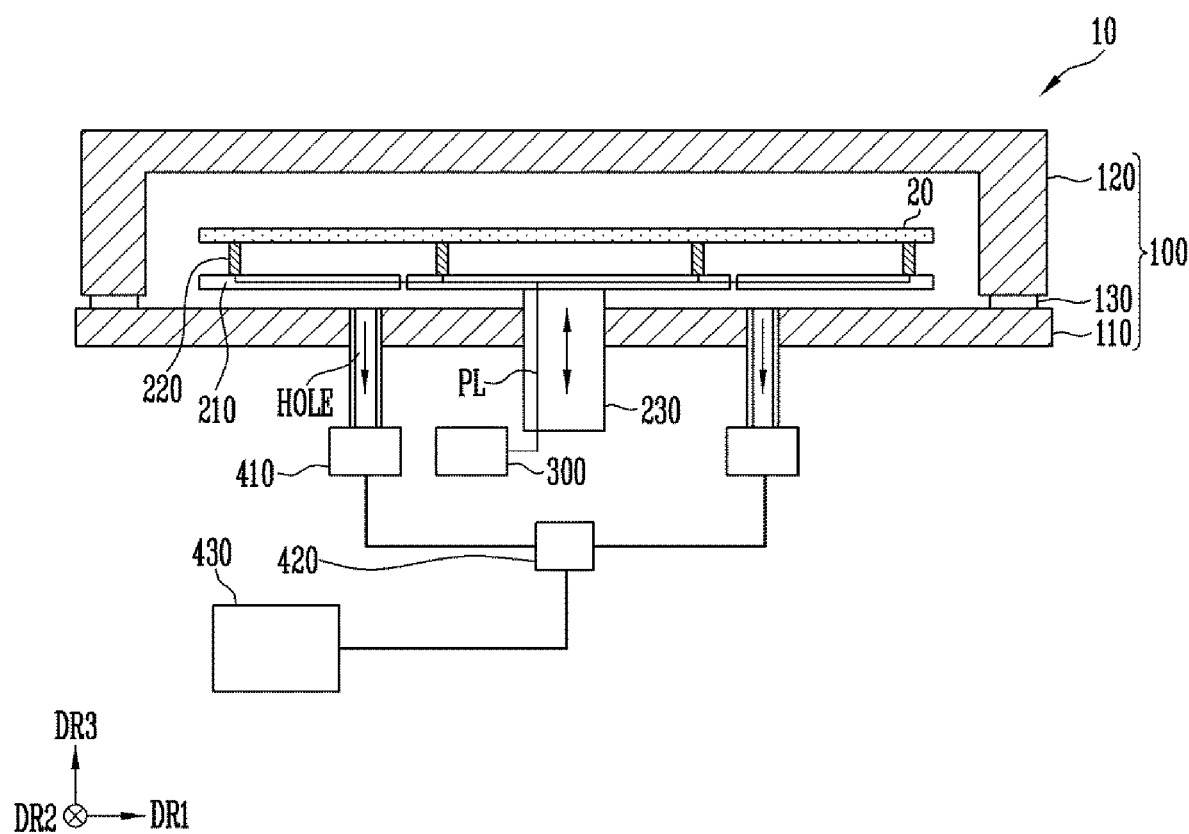
FIGS. 1A and 1B are sectional views illustrating an example of a vacuum dryer in accordance with various embodiments of the present disclosure.

Reference will now be made in detail to various embodiments of the present disclosure, specific examples of which are illustrated in the accompanying drawings and described below, since the embodiments of the present disclosure can be variously modified in many different forms. However, the present disclosure is not limited to the following embodiments and may be modified into various forms.

Some elements which are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

Figure 1B:
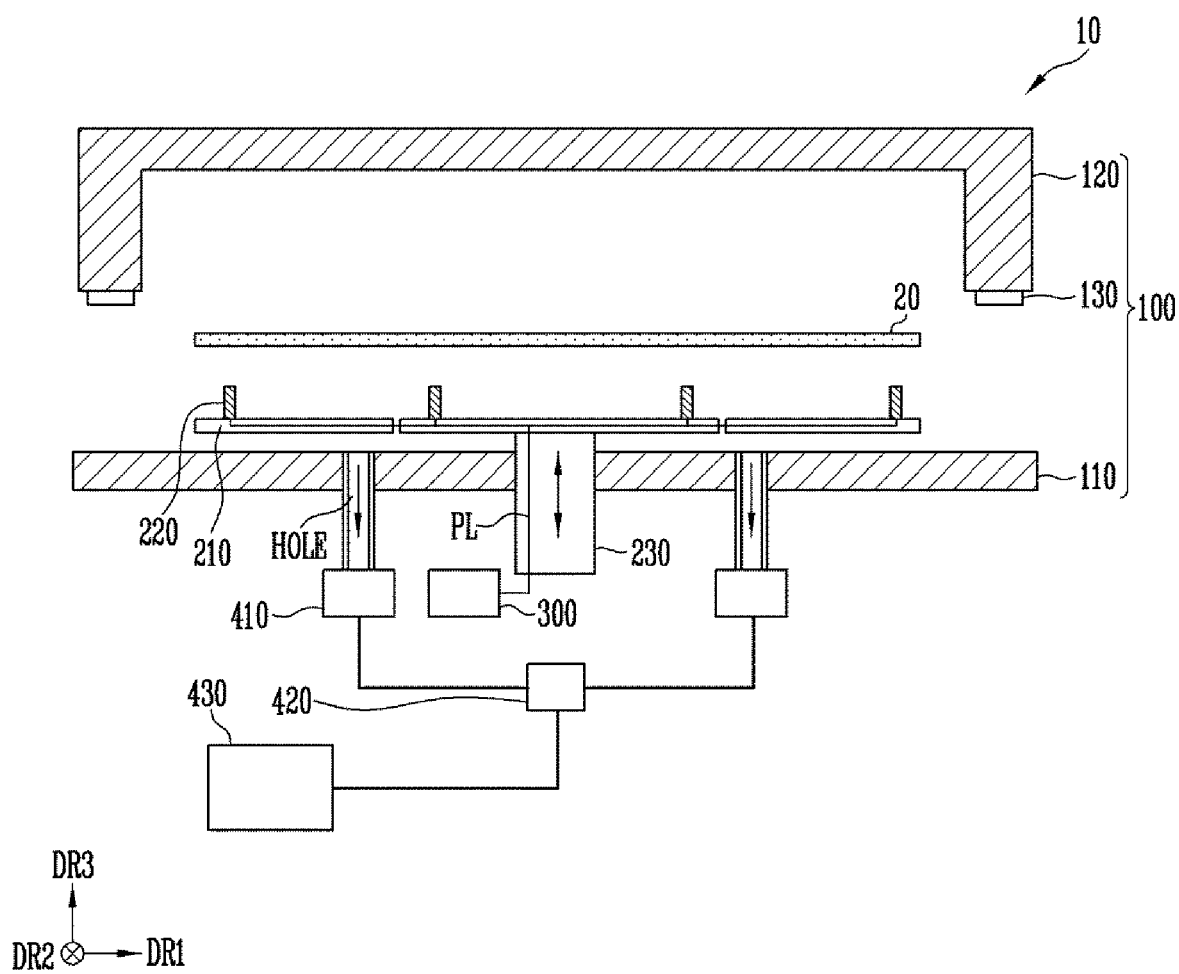
Figure 2:
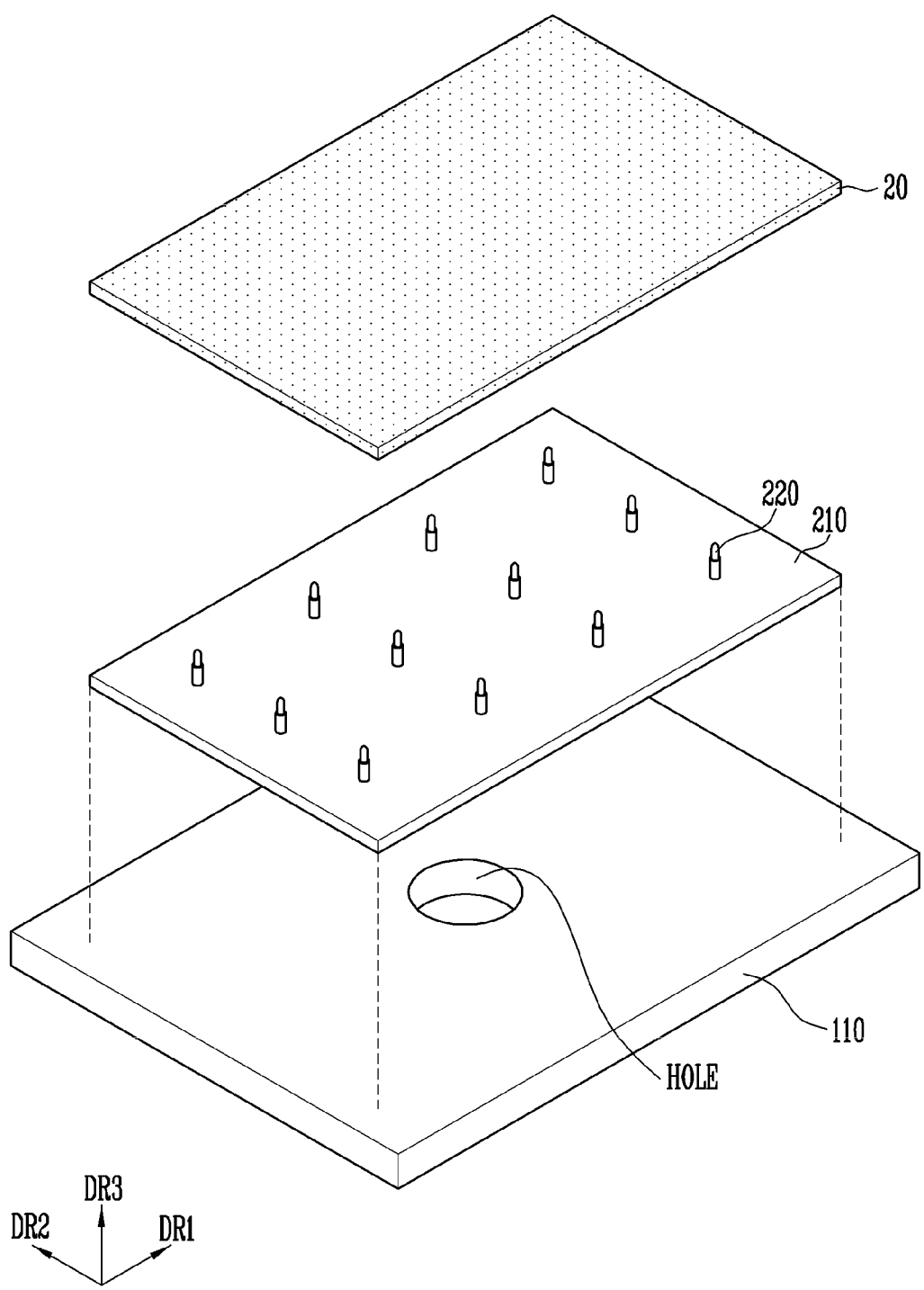
FIG. 2 is a diagram illustrating support pins and a support plate that are included in the vacuum dryer of FIG. 1A, in accordance with an embodiment of the present disclosure.

FIGS. 1A and 1B are sectional views illustrating an example of a vacuum dryer 10 in accordance with various embodiments of the present disclosure. FIG. 1A illustrates a sealed state (or a closed state) of the vacuum dryer 10, and FIG. 1B illustrates an unsealed state (or an open state) of the vacuum dryer 10. FIG. 2 is a diagram illustrating a series of support pins 220 and a support plate 210 that are included in the vacuum dryer 10 of FIG. 1A, in accordance with an embodiment of the present disclosure.

Referring to FIGS. 1A, 1B, and 2, the vacuum dryer 10 is configured to reduce the pressure of internal space thereof (or create a vacuum or substantially a vacuum in the internal space) to remove solvent from photoresist (or photoresist solvent) applied on a substrate 20.

In one or more embodiments, the vacuum dryer 10 may include a chamber 100, a support pin 220 (or support pins), a first valve 410, a second valve 420, and a pump 430. The vacuum dryer 10 may further include a support plate 210 and a lifter 230.

In one or more embodiments, the chamber 100 may include a base plate 110 and a cover 120. The base plate 110 may have a planar structure (e.g., a flat plate). The cover 120 may have a structure such that a lower surface thereof is recessed in a third direction DR3 (or upward). For example, in one or more embodiments, the cover 120 may include an upper planar structure (e.g., an upper plate) and one or more flanges extending around a periphery of the upper planar structure and downward opposite to the third direction DR3 toward the base plate 110. Although FIG. 2 illustrates that the base plate 110 has a rectangular planar shape, this is only for illustrative purposes, and the planar shape of the base plate 110 and the shape of the cover 120 corresponding to that of the base plate 110 may be changed in various ways.

The base plate 110 may be fixed, and the cover 120 may move upward and/or downward. When the cover 120 moves downward and thus comes into close contact with the base plate 110, an interior or internal space (or sealed space) may be formed between the base plate 110 and the cover 120, i.e., in the chamber 100.

The chamber 100 may further include a sealing member 130. The sealing member 130 may be provided between the base plate 110 and the cover 120 and disposed along the perimeter of the lower surface of the cover 120. For example, the sealing member 130 may be a packing having elasticity, or may seal the space of the chamber 100 between the base plate 110 and the cover 120 when the cover 120 comes into close contact with the base plate 110.

A hole (or an exhaust air hole) HOLE in fluid communication with the outside may be formed in the base plate 110. The hole HOLE may be coupled to a pump 430 through a pipe. The internal space of the chamber 100 may be reduced in pressure or be in a vacuum state or substantially in a vacuum state by the operation of the pump 430.

The support plate 210 may be disposed over the base plate 110. The support plate 210 may have a planar structure (e.g., a flat plate). In an embodiment, the support plate 210 may include a plurality of plates which are disposed on one plane (e.g., a plane defined by a first direction DR1 and a second direction DR2). For example, the support plate 210 may include a first plate corresponding to a central portion of the base plate 110, and a second plate corresponding to a peripheral portion of the base plate 110.

The support plate 210 is mounted to the lifter 230, and may be adjusted in height relative to the base plate 110 by upward/downward operation of the lifter 230. For instance, the first plate may be mounted to the lifter 230 so that the height of the first plate may be adjusted by the lifter 230.

The one or more support pins 220 may protrude from an upper surface of the support plate 210 in the third direction DR3 (or in a thickness direction). In one or more embodiments in which the vacuum dryer 10 includes a series of support pins 220, the support pins 220 may be distributed and disposed on the upper surface of the support plate 210 at positions spaced apart from each other by predetermined distances. Although in the illustrated embodiment each of the one or more support pins 220 have a cylindrical or a pin shape, the present disclosure is not limited thereto.

The one or more support pins 220 may support the substrate 20. For example, the one or more support pins 220 may come into contact with a lower surface of the substrate 20 such that each of the one or more support pins 220 is opposite to an upper surface of the substrate 20 to which photoresist (or photoresist solvent) is applied. In one or more embodiments, the one or more support pins 220 may directly support the substrate 20.

Although FIGS. 1A to 2 illustrate that the one or more support pins 220 are provided on the support plate 210, the present disclosure is not limited thereto. As needed, the one or more support pins 220 may be provided on the base plate 110.

The configuration (i.e., the shape and the structure) of one of the support pins 220 will be described in detail below with reference to FIGS. 3D and 4.

The lifter 230 may be disposed under the support plate 210 to support the support plate 210 and move the support plate 210 upward or downward relative to the base plate 110. The lifter 230 may adjust the height (i.e., the position with respect to the third direction DR3) of the substrate 20 between the lifter 230 and a transport unit (e.g., a transport arm) which transfers the substrate 20 to the vacuum dryer 10. For example, after the cover 120 is lifted to open the chamber 100, the transport unit on which the substrate 20 has been loaded may be moved into the chamber 100. Thereafter, the one or more support pins 220 (and the support plate 210) are moved upward along the third direction DR3 to a predetermined position by the operation of the lifter 230 so that the one or more support pins 220 may support the substrate 20. Subsequently, the transport unit may move out of the chamber 100, and the one or more support pins 220 and the substrate 20 may be moved downward by the operation of the lifter 230.

A power supply 300 (or a power supply device) may apply power (or voltage) to the one or more support pins 220. For example, the power supply 300 may be electrically coupled to each of the one or more support pins 220 through a power line PL. Although FIG. 1A illustrates that the power line PL is coupled to the one or more support pins 220 via the lifter 230 and the support plate 210, this is only for illustrative purposes, and the present disclosure is not limited thereto. The shape and arrangement of the power line PL may be changed in various ways so long as the power supply 300 and the one or more support pins 220 can be electrically coupled to each other. Furthermore, although FIG. 1A illustrates that each of the one or more support pins 220 are electrically coupled to the other support pin 220 through the power line PL, the present disclosure is not limited thereto. For example, in one or more embodiments in which the vacuum dryer 10 includes a series of support pins 220, each support pin 220 may be coupled, independently from the other support pins 220, to the power supply 300, and power to be applied to each of the support pins 220 may be independently controlled.

When the power supply 300 applies power to the one or more support pins 220, each of the one or more support pins 220 may be electrified or become an electrified body. The one or more electrified support pins 220 may cause the photoresist (e.g., the solvent included in the photoresist) applied on the upper surface of the substrate 20 to flow in one or more contact portions (or contact areas) of the substrate 20 that come into contact with the support pin 220. The flow of photoresist may make the overall thickness of the photoresist uniform. The operation of the power supply 300 will be described below along with a dry process with reference to FIGS. 5A to 5C.

The first vale 410 and the second valve 420 may be disposed between the chamber 100 and the pump 430. The first valve 410 may be directly coupled to the hole HOLE, and the second valve 420 may be directly coupled to the pump 430. The first valve 410 and the second valve 420 may control a flow rate between the chamber 100 and the pump 430. When the chamber 100 is sealed, the first valve 410 and the second valve 420 may open, and air in the chamber 100 may be removed to the outside by the pump 430.

As described with reference to FIGS. 1A to 2, the vacuum dryer 10 may include the power supply 300 coupled to the one or more support pins 220. Therefore, variation (deviation) in thickness of the photoresist on the substrate 20 due to contact between the substrate 20 and the one or more support pins 220 may be compensated for or mitigated by electrifying the one or more support pins 220 from the power supply 300.

Figure 3A:
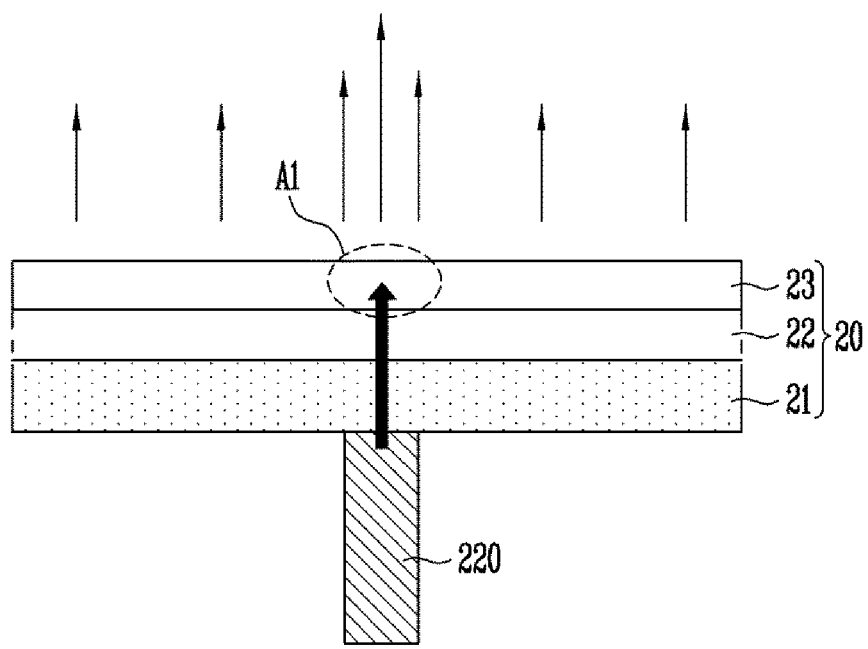
FIGS. 3A and 3B are diagrams illustrating a comparative example of formation of a photoresist by a vacuum dryer.
Figure 3B:
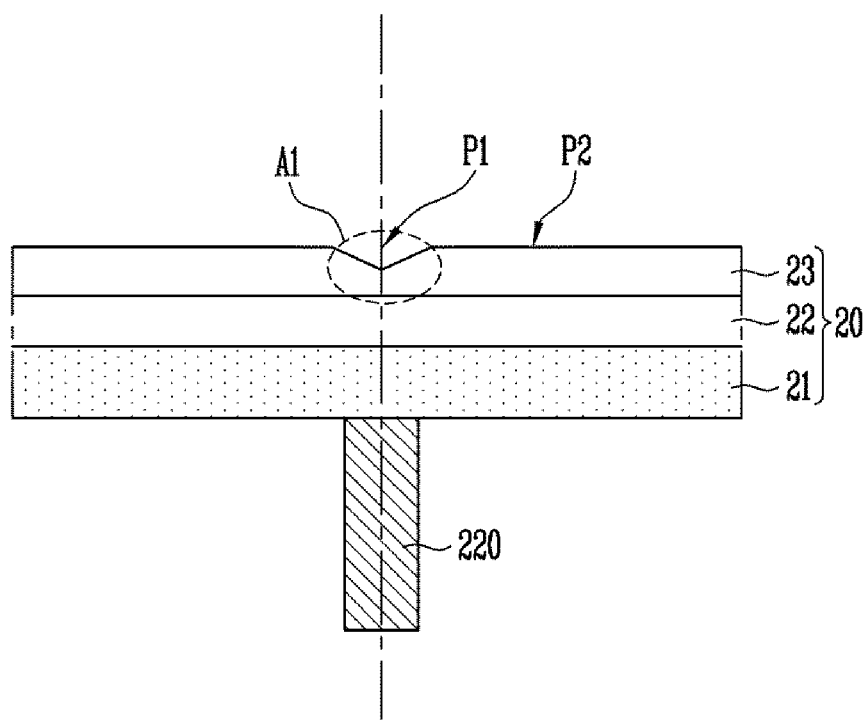
Figure 3C:
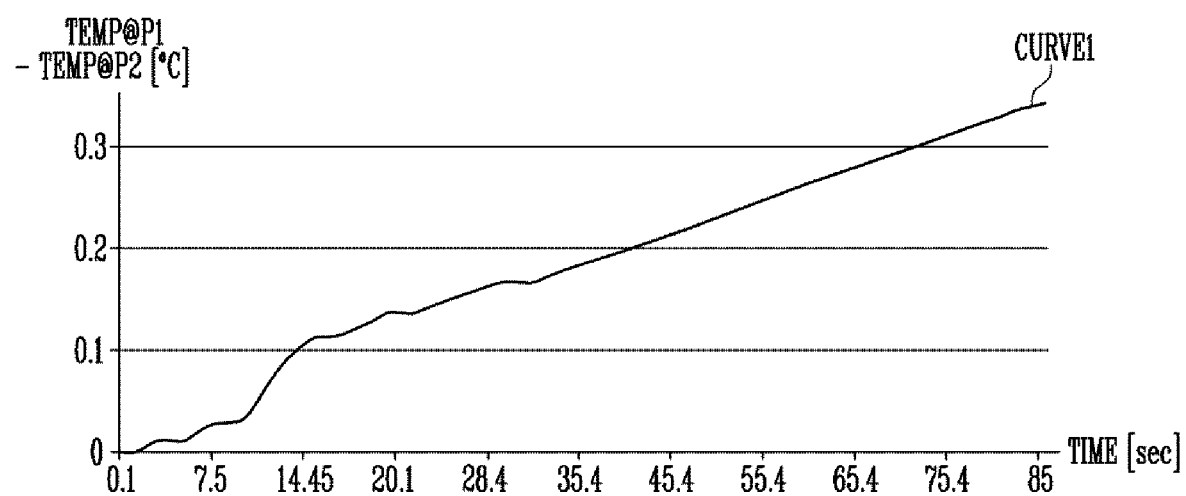
FIG. 3C is a graph illustrating the temperature of a first area of FIG. 3B.

FIGS. 3A and 3B are diagrams illustrating a comparative example of formation of a photoresist by the vacuum dryer. FIG. 3A illustrates the substrate 20 that is not completely dried. FIG. 3B illustrates the substrate 20 that has been completely dried. FIG. 3C is a graph illustrating the temperature of a first area of FIG. 3B.

Referring to FIGS. 3A and 3B, the substrate 20 may include a base layer 21, a lower layer 22, and a photoresist layer 23.

The base layer 21 may form a base member of a display device, a display panel, etc. The base layer 21 may be rigid or flexible, and the material or properties thereof are not particularly limited. For example, the base layer 21 may be formed of glass.

The lower layer 22 may be formed on the base layer 21, and include at least one layer, pattern, or the like which is formed before a photoresist is applied thereto. In one or more embodiments, the lower layer 22 may be omitted.

The photoresist layer 23 may be formed on the lower layer 22, and may have fluidity. In an embodiment, the photoresist layer 23 may include a photoresist material (or a photoactive compound, referred hereinafter to as "PAC"), resin, and solvent.

In various embodiments, solvent may include polar molecules. For example, the solvent may include n-butyl acetate (nBA), methyl 3-methoxypropionate (MMP), propylene glycol monomethyl ether (PGME), propylene glycol monomethyl ether acetate (PGMEA), ethyl 3-ethoxypropionate (EEP), ethyl lactate (EL), propylene glycol monomethyl ester acetate (PGMEP), etc. In an embodiment where solvent of the photoresist layer 23 includes polar molecules, electrostatic attraction force may be applied to the solvent in space in which an electric field is formed.

As described with reference to FIGS. 1A to 2, the substrate 20 may be supported by the one or more support pins 220.

During an operation of vacuum-drying the substrate 20, solvent in the photoresist layer 23 is evaporated, and thus the temperature of the substrate 20 may be reduced.

Since the one or more support pins 220 come into direct contact with the substrate 20 (or the base layer 21), heat required for evaporating solvent (i.e., solvent in the photoresist layer 23) through the one or more support pins 220 may be transferred to the substrate 20. Therefore, the temperature of a contact portion P1 (or a first area A1) of the substrate 20 that comes into contact with or overlaps one of the one or more support pins 220 may be higher than the temperature of a non-contact portion P2 (i.e., an area that does not contact with or does not overlap any of the one or more support pins 220, or an area spaced apart from each of the one or more support pins 220). In other words, the overall temperature of the substrate 20 may not be uniform.

As illustrated in FIG. 3C, as dry time TIME passes, a difference between the temperature TEMP@P1 of the contact portion P1 and the temperature TEMP@P2 of the non-contact portion P2, i.e., TEMP@P1—TEMP@P2, may increase, as indicated by the cure CURVE1. Even when the one or more support pins 220 are made of material having a relatively low thermal conductivity (e.g., polyetheretherketone (PEEK)), a temperature difference may occur although the temperature difference is relatively lower.

If a temperature difference occurs, an evaporating rate of solvent in the contact portion P1 (or the first area A1) may be relatively increased, and PAC and resin in the photoresist layer 23 may move to the non-contact portion P2 that contains a comparatively large amount of solvent. In other words, due to variation in concentration of the photoresist layer 23, the solute (i.e., the PAC and resin) may move.

Therefore, as illustrated in 3B, in the substrate 20 that has been completely dried, the thickness of the photoresist layer 23 (or photoresist) in the contact portion P1 may be less than the thickness of the photoresist layer 23 in the non-contact portion P2. The difference in thickness of the photoresist layer 23 leads to a difference in a critical dimension (e.g., a width of a pattern) after an exposure process. Accordingly, the difference in thickness of the photoresist layer 23 may cause spots which are visible to a user.

FIG. 3D is a diagram illustrating various examples of the support pin 220 included in the vacuum dryer of FIG. 1A, in accordance with various embodiments of the present disclosure. FIG. 3D illustrates the differences in thickness of the photoresist (i.e., the photoresist formed on the substrate 20 through the dry process) corresponding to the different shapes of the support pin 220.

Referring to FIG. 3D, the support pin 220 may have various shapes. For example, the support pin 220 may have a cylindrical shape TYPE1, a hemispherical shape TYPE2, a triangular pyramidal shape TYPE3, a needle shape TYPE4.

In the embodiment of the hemispherical shape TYPE2, the surface area of the contact portion P1 of the substrate 20 that comes into contact with or overlaps with the support pin 220 is comparatively large, so that the variation in thickness of the contact portion P1 may be the largest among the cylindrical shape TYPE1, the hemispherical shape TYPE2, the triangular pyramidal shape TYPE3 and the needle shape TYPE4. In the case of the needle shapeTYPE4, the surface area of the contact portion P1 of the substrate 20 that comes into contact with or overlaps with the support pin 220 is comparatively small, so that the variation in thickness of the contact portion P1 may be smallest.

To minimize the surface area of the portion of the substrate 20 that comes into contact with the support pin 220, i.e., to minimize thermal conduction from the support pin 220 to the substrate 20, the support pin 220 may have a needle shape TYPE4. However, in this case, as illustrated in FIG. 3D, a difference in thickness may not also be prevented from occurring.

In the vacuum dryer 10 in accordance with various embodiments of the present disclosure, the one or more support pins 220 may be electrified by supplying power from the power supply 300 to the one or more support pins 220. Hence, the difference in thickness of the photoresist may be more markedly reduced or eliminated. Furthermore, since the operating principle of the vacuum dryer 10 differs from that of the method of minimizing thermal conduction, the one or more support pins 220 provided in the vacuum dryer 10 in accordance with various embodiments of the present disclosure may have various shapes shown in FIG. 3D. In other words, although the support pin 220 has various shapes (e.g., a cylindrical shape TYPE1, a hemispherical shape TYPE2, a triangular pyramidal shape TYPE3, or a needle shape TYPE4), the difference in thickness of the photoresist may be minimized or eliminated due to characteristics of the vacuum dryer 10.

Figure 4:
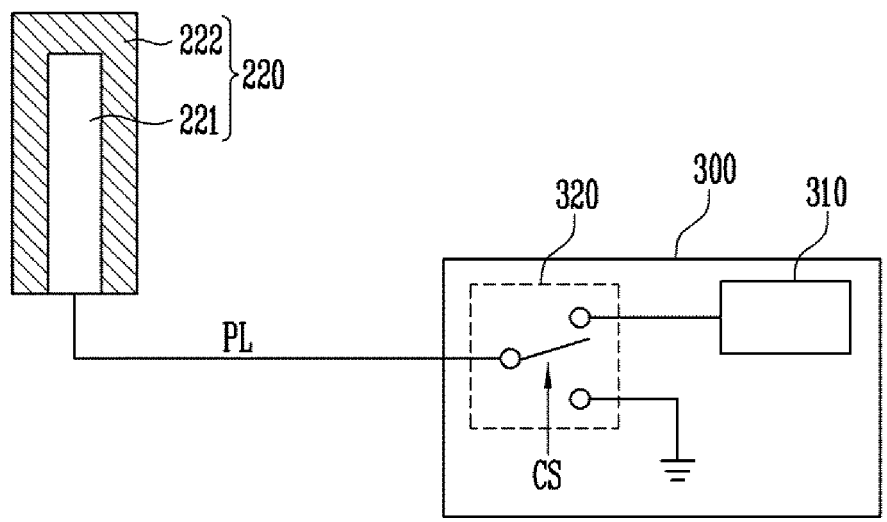
FIG. 4 is a diagram illustrating a support pin and a power supply that are included in the vacuum dryer of FIG. 1A, in accordance with an embodiment of the present disclosure.

FIG. 4 is a diagram illustrating a support pin 220 and a power supply 300 that are included in the vacuum dryer of FIG. 1A, in accordance with an embodiment of the present disclosure.

Referring to FIG. 4, the support pin 220 may include a core 221 (or a central part, or an electrode) and a shell 222 (or, a peripheral part, or an outer part).

Although the core 221 may have a rectangular cross-sectional shape (or a cylindrical shape TYPE1 or a needle shape TYPE4 described with reference to FIG. 3D), this is only for illustrative purposes, and the shape of the core 221 may be changed in various ways. For example, if the support pin 220 has a hemispherical shape TYPE2, the core 221 may have a hemispherical shape.

The core 221 may include conductive material, e.g., metal. When power is applied from the power supply 300 to the support pin 220, the core 221 may become an electrified body. For example, when a positive voltage or a negative voltage is applied to the support pin 220, the core 221 may be electrified with a positive (+) charge or a negative (−) charge.

The shell 222 may enclose the core 221. The shell 222 may include insulating material such as PEEK, carbon PEEK, and/or polyvinylidene fluoride (PVDF). When the core 221 is electrified, the shell 222 may be polarized (or dielectrically polarized).

In various embodiments, the shell 222 may include a material having a low thermal conductivity. For example, the thermal conductivity of the shell 222 may be 0.3 W/mK or less, and the shell 222 may include, for instance, polyphenylene sulfide (PPS) having a thermal conductivity of 0.29 W/mK, PEEK having a thermal conductivity of 0.26 W/mK, polytetrafluoroethylene having a thermal conductivity of 0.5 W/mK, or any other suitable material having a lower thermal conductivity. The voltage level of the power supplied by the power supply 300 may be set or determined based on the thermal conductivity of the shell 222 (or the support pin 220). In an embodiment where the thermal conductivity of the shell 222 is relatively high, in other words, as the heat transfer rate from the support pin 220 to the substrate 20 is increased, the voltage level of the power supplied by the power supply 300 may be increased. In this case, a defective product may be caused by the high voltage level of the power supplied by the power supply 300. Therefore, the shell 222 (and the support pin 220) may be made of material having a low thermal conductivity to prevent or mitigate against the creation of a defective product due to the high voltage level.

The power supply 300 may include a power generation circuit 310 and a switching circuit 320.

The power generation circuit 310 may generate power (or voltage) having a fixed voltage level. For example, the power generation circuit 310 may be implemented as a direct current (DC) converter.

In some embodiments, the power generation circuit 310 may determine the voltage level of the supplied power based on characteristics of the solvent included in the photoresist layer 23 (refer to FIG. 3A). For example, if the polarity of the solvent is comparatively high, the power generation circuit 310 may comparatively reduce the voltage level (or magnitude) of the power. For example, if the polarity of the solvent is comparatively low, the power generation circuit 310 may comparatively increase the voltage level of the power.

In some embodiments, the power generation circuit 310 may determine the voltage level of the supplied power based on the thermal conductivity of the support pin 220. For example, if the thermal conductivity of the support pin 220 is comparatively high, the power generation circuit 310 may comparatively increase the voltage level (or magnitude) of the power. For example, if the thermal conductivity of the support pin 220 is comparatively low, the power generation circuit 310 may comparatively reduce the voltage level of the power.

The switching circuit 320 may couple the power line PL to the power generation circuit 310 in response to a control signal CS provided from an external device. As will be described with reference to FIGS. 5A to 5C, when or after a dry process starts (i.e., when a control signal CS indicating that the dry process starts or has started is received), the switching circuit 320 may couple the power line PL to an output terminal of the power generation circuit 310.

In some embodiments, the switching circuit 320 may couple the power line PL to a reference power supply (e.g., a ground) in response to a control signal CS. In an embodiment where the power line PL floats while the dry process is not performed, static electricity may be drawn or generated through the power line PL. Therefore, while the dry process is not performed, the switching circuit 320 may couple the power line PL to the reference power supply.

As described with reference to FIG. 4, the one or more support pins 220 may include metal and thus be electrified by the power provided from the power supply 300. The power supply 300 may apply power to the one or more support pins 220 through the switching circuit 320 or couple the one or more support pins 220 to the ground.

Although FIG. 4 illustrates that the power supply 300 includes the switching circuit 320, the present disclosure is not limited thereto. For example, the power supply 300 (or the power generation circuit 310) may control the voltage level of the power in response to a control signal CS so that the power has a first voltage level (i.e., a voltage level for electrifying the one or more support pins 220) or a ground voltage level (i.e., a voltage level for grounding the one or more support pins 220).

Figure 5A:
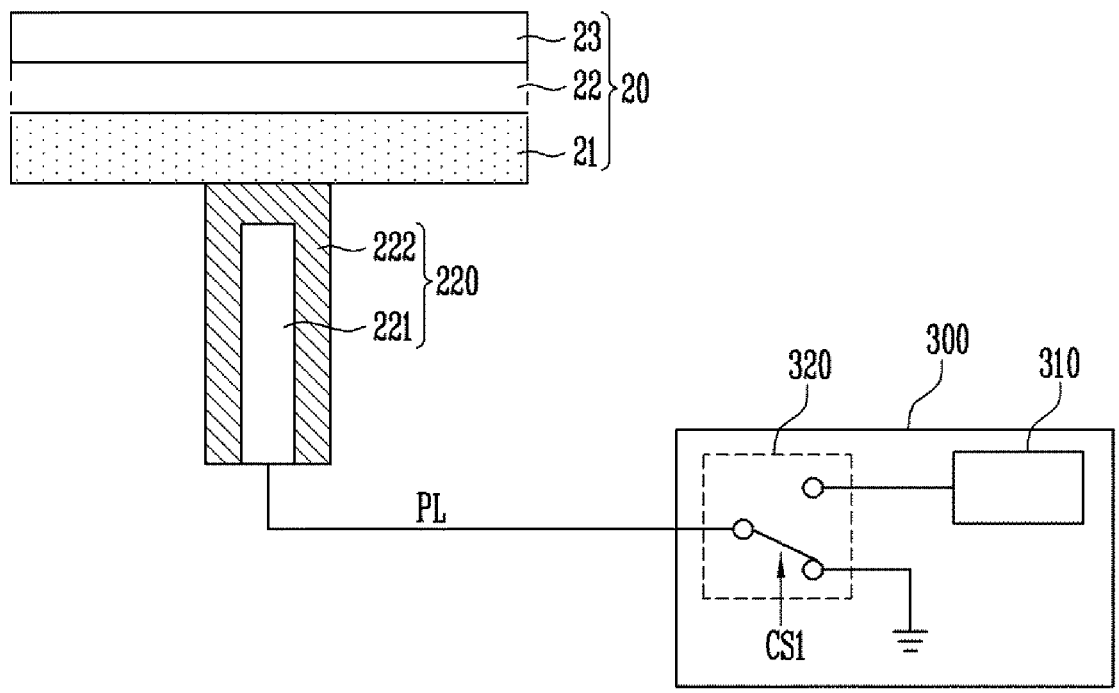
FIGS. 5A to 5C are diagrams for describing an operation of the support pin and the power supply of FIG. 4.
Figure 5B:
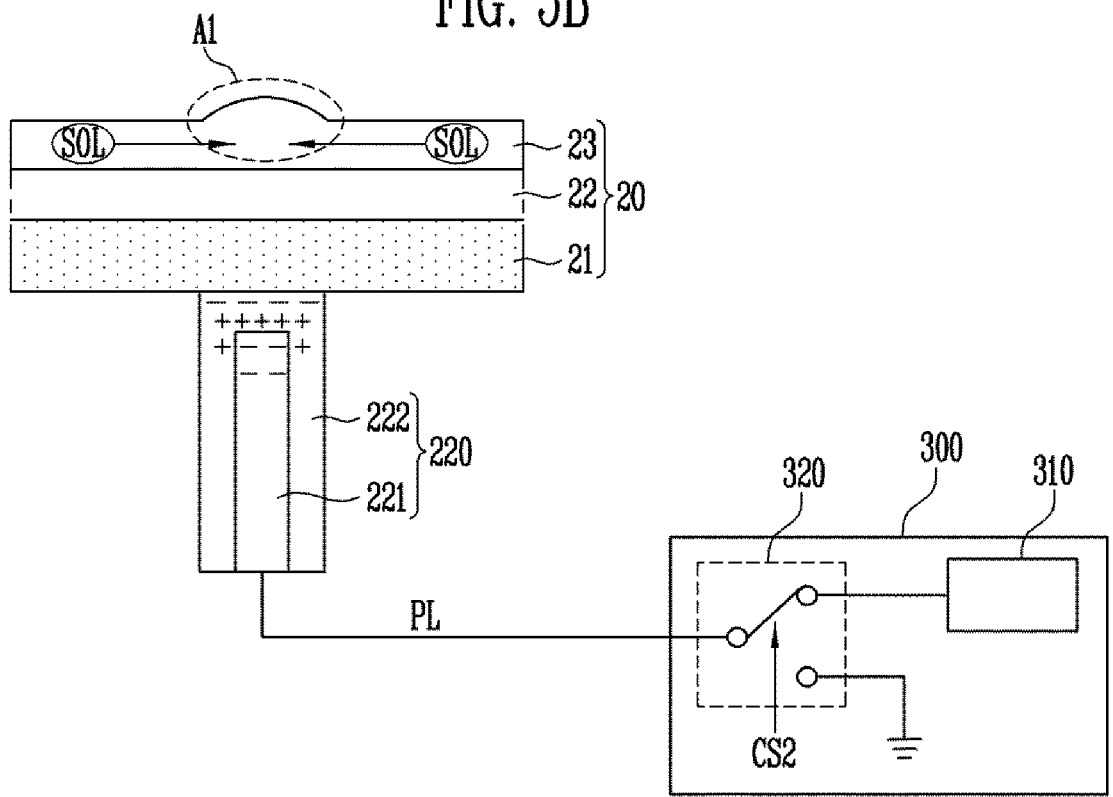
Figure 5C:
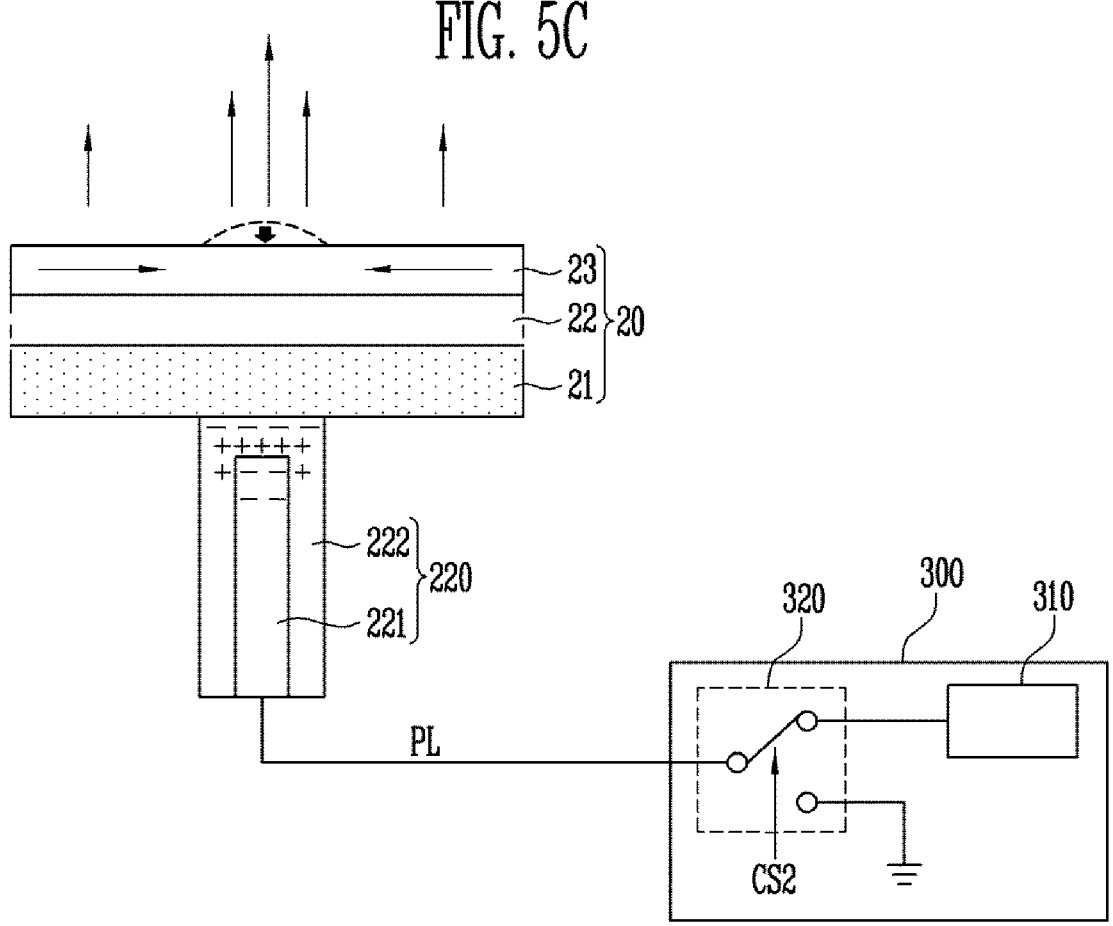

FIGS. 5A to 5C are diagrams for describing an operation of one of the one or more support pins 220 and the power supply 300 of FIG. 4. FIGS. 5A to 5C illustrate, during a dry process, the operation of the power supply 300 including a first task of supplying the substrate 20, a second task immediately before decompression (or immediately after the decompression), and a third task during the decompression, respectively.

At the first task, as illustrated in FIG. 5A, the support pin 220 may be coupled to the ground. For example, until the decompression of the vacuum dryer 10 starts, a first control signal CS1 may be provided to the power supply 300, and the switching circuit 320 may couple the support pin 220 to the ground in response to the first control signal CS1. For instance, in an embodiment where the chamber 100 opens or the cover 120 is spaced apart from the base plate 110, the first control signal CS1 may be provided to the power supply 300, and the switching circuit 320 may couple the support pin 220 to the ground in response to the first control signal CS1.

Thereafter, at the second task, as illustrated in FIG. 5B, power is applied to the support pin 220 from the power generation circuit 310, and the support pin 220 may be electrified. For example, immediately before or after the decompression of the vacuum dryer 10 starts, a second control signal CS2 may be provided to the power supply 300, the switching circuit 320 may couple the support pin 220 to the power generation circuit 310 in response to the second control signal CS2, and the power generated from the power generation circuit 310 may be provided to the support pin 220. For instance, in an embodiment where the chamber 100 is closed or the cover 120 comes into close contact with the base plate 110, the second control signal CS2 may be provided to the power supply 300, the switching circuit 320 may couple the support pin 220 to the power generation circuit 310 in response to the second control signal CS2, and the power generated from the power generation circuit 310 may be provided to the support pin 220.

For example, the core 221 of each support pin 220 may be electrified with a negative (−) charge, an inner part of the shell 222 (i.e., a part of the shell 222 that is adjacent to the core 221) may be polarized to a positive (+) polarity, and an outer part of the shell 222 (i.e., a part of the shell 222 that is adjacent to the substrate 20) may be polarized to a negative (−) polarity. In other words, the support pin 220 may be electrified with a negative (−) charge.

Although FIG. 5B illustrates that the support pin 220 is electrified with a negative (−) charge, this is only for illustrative purposes, and the support pin 220 may be electrified with a positive (+) charge.

The electrified support pin 220 may pull the solvent SOL of the photoresist layer 23 using electrostatic attractive force, so that the solvent SOL of the photoresist layer 23 may move to the first area A1 (i.e., a portion of the substrate 20 that comes into contact with or overlaps the support pin 220). That is, the solvent SOL having a polarity may be pulled or drawn to the first area A1 by the electrostatic attractive force of the support pin 220. Consequently, the thickness of the first area A1 of the photoresist layer 23 may be comparatively increased.

Thereafter, at the third task, as illustrated in FIG. 5C, the solvent SOL of the photoresist layer 23 may evaporate. Since the support pin 220 comes into direct contact with the substrate 20, heat may be transferred to the substrate 20 through the support pin 220, and the evaporation rate of the solvent SOL in the first area A1 may be relatively high compared to the areas or portions of the substrate 20 that are not in contact with and do not overlap with the one or more support pins 220. If the movement speed of the solvent SOL due to the electrostatic attractive force of the support pin 220 is set to be equal or similar to a difference in evaporation speed (i.e., a difference between the evaporation speed of the contact portion P1 (or first area A1) and the evaporation speed of the non-contact portion P2), the thickness of the photoresist layer 23 (or the photoresist) in the first area A1 may remain identical or substantially identical with the thickness of the photoresist layer 23 in the other areas (i.e., the non-contact portion P2). In other words, the overall thickness of the photoresist layer 23 may remain uniform or substantially uniform.

As described with reference to FIGS. 5A to 5C, since the solvent SOL of the photoresist layer 23 may be moved to the first area A1 by the electrostatic attractive force of the support pin 220, a difference in thickness of the photoresist layer 23 may be mitigated or prevented from occurring even if the solvent SOL in the first area A1 relatively rapidly evaporates.

In a vacuum dryer in accordance with various embodiments of the present disclosure, support pins that support a substrate to be dried may be electrified by applying power to the support pins, so that solvent (i.e., solvent including polar molecules) of photoresist may be drawn (or concentrated) onto a contact portion of the substrate from a non-contact portion thereof by electrostatic force. Therefore, even if the solvent comparatively rapidly evaporates on the contact portion, the thickness of the photoresist on the contact portion may be identical or substantially identical with the thickness of the photoresist on the non-contact portion. In other words, the thickness of the photoresist may remain uniform or substantially uniform.

While the spirit and scope of the present disclosure are described by detailed exemplary embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the present disclosure is not limited by detailed descriptions of the present specification, and should be defined by the accompanying claims. Furthermore, all changes or modifications of the present disclosure derived from the meanings and scope of the claims, and equivalents thereof should be construed as being included in the scope of the present disclosure.

What is claimed is:

1. A vacuum dryer comprising:
    a chamber configured to provide an interior space;
    support pins in the interior space proximate to a bottom of the chamber;
    a power supply configured to supply power to the support pins to electrify the support pins; and
    a pump coupled to the interior space in the chamber.

2. The vacuum dryer according to claim 1, further comprising a substrate in the interior space to be dried, wherein the support pins directly support the substrate.

3. The vacuum dryer according to claim 2, further comprising a photoresist is on the substrate,
    wherein the photoresist includes a solvent having a polarity.

4. The vacuum dryer according to claim 3, wherein a voltage level of the power is based on a magnitude of the polarity of the solvent, and wherein the voltage level of the power is configured to decrease as the polarity of the solvent increases.

5. The vacuum dryer according to claim 3, wherein a temperature of a contact portion of the substrate that contacts one of the support pins is higher than a temperature of a non-contact portion spaced apart from each of the support pins.

6. The vacuum dryer according to claim 1, wherein each of the support pins has one shape of a cylindrical shape, a hemispherical shape, a conical shape, or a needle shape.

7. The vacuum dryer according to claim 1, wherein each of the support pins comprises a core and a shell configured to enclose the core,
    wherein the core includes conductive material, and
    wherein the shell includes insulating material.

8. The vacuum dryer according to claim 7, wherein a thermal conductivity of at least one of the support pins is approximately 0.3 W/mK or less.

9. The vacuum dryer according to claim 8, wherein a voltage level of the power is based on the thermal conductivity, and wherein the voltage level of the power is configured to increase as the thermal conductivity increases.

10. The vacuum dryer according to claim 4, wherein the power supply comprises:
    a power generation circuit configured to generate the power; and
    a switching circuit configured to couple an output terminal of the power generation circuit to the support pins in response to a first control signal.

11. The vacuum dryer according to claim 10, wherein the switching circuit is configured to couple the support pins to a ground in response to a second control signal.

12. The vacuum dryer according to claim 11, wherein the switching circuit is configured to couple the support pins to the ground before the interior space is decompressed.

13. The vacuum dryer according to claim 11, wherein the switching circuit is configured to couple the output terminal of the power supply to the support pins when the interior space is decompressed.

14. The vacuum dryer according to claim 13,
    wherein, when each of the support pins is electrified by the power from the power supply, a thickness of the photoresist in a first area of the substrate becomes greater than a thickness of the photoresist in a second area of the substrate, the first area of the substrate overlapping one of the support pins, and the second area of the substrate being spaced apart from the support pins.

15. The vacuum dryer according to claim 14, wherein while the interior space is decompressed, the thickness of the photoresist in the first area is reduced to be substantially identical to the thickness of the photoresist in the second area.

16. The vacuum dryer according to claim 1,
    wherein the chamber comprises a base plate and a cover, and
    wherein the power supply is configured to apply the power having a first voltage level to the support pins when the cover comes into close contact with the base plate.

17. The vacuum dryer according to claim 16, wherein the power supply is configured to adjust a voltage level of the power to a ground voltage level when the cover is spaced apart from the base plate.

18. The vacuum dryer according to claim 16, further comprising:
    a support plate over the base plate; and
    a lifter coupled to the support plate and configured to adjust a height of the support plate in the interior space, and
    wherein the support pins are distributed on the support plate.

19. The vacuum dryer according to claim 18, wherein the support pins are electrically coupled to each other through a power line in the support plate.

20. The vacuum dryer according to claim 18, wherein the support pins are coupled independently of each other to the power supply.

* * * * *